(12) United States Patent
Sprenger et al.

(10) Patent No.: US 12,429,546 B2
(45) Date of Patent: Sep. 30, 2025

(54) SYSTEM AND METHOD FOR DIFFUSION GROUP CYCLING

(71) Applicant: GE Precision Healthcare LLC, Waukesha, WI (US)

(72) Inventors: Tim Sprenger, Munich (DE); Baolian Yang, Pewaukee, WI (US); Arnaud Guidon, Boston, MA (US); Gaohong Wu, New Berlin, WI (US); Suchandrima Banerjee, Berkeley, CA (US); Douglas Link, Lake Mills, WI (US); Jaemin Shin, Haworth, NJ (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 170 days.

(21) Appl. No.: 18/545,499

(22) Filed: Dec. 19, 2023

(65) Prior Publication Data
US 2025/0199103 A1    Jun. 19, 2025

(51) Int. Cl.
G01R 33/563    (2006.01)

(52) U.S. Cl.
CPC ................ *G01R 33/56341* (2013.01)

(58) Field of Classification Search
None
See application file for complete search history.

(56) References Cited

U.S. PATENT DOCUMENTS

| 10,809,339 B2 | 10/2020 | Li et al. |
| 2021/0124004 A1* | 4/2021 | Drobnitzky ...... G01R 33/56341 |
| 2023/0280432 A1 | 9/2023 | Feiweier |

FOREIGN PATENT DOCUMENTS

| CN | 100426003 C * | 10/2008 | ....... G01R 33/56341 |
| DE | 102011006851 A1 * | 10/2012 | ....... G01R 33/56509 |

\* cited by examiner

*Primary Examiner* — Rodney E Fuller
(74) *Attorney, Agent, or Firm* — Fletcher Yoder, P.C.

(57) ABSTRACT

A computer-implemented method and system for performing magnetic resonance diffusion weighted imaging of an object includes generating, via a processor, a diffusion weighted imaging sequence where all diffusion gradients are allocated into N groups such that all imaging slices are acquired for all the diffusion gradients corresponding to a group of the N groups back-to-back in $A_n*TR$, wherein N is two or larger, wherein $A_n$ is a number of diffusion gradients of each group of the N groups and TR is repetition time, and wherein in each TR every diffusion gradient of the group of the N groups is applied at least once. The computer-implemented method and system also includes acquiring, via the processor, imaging slices for multiple groups of the N groups utilizing the diffusion weighted imaging sequence during a scan of the object utilizing a magnetic resonance imaging scanner.

20 Claims, 8 Drawing Sheets

SYSTEM AND METHOD FOR DIFFUSION GROUP CYCLING

BACKGROUND

The subject matter disclosed herein relates to medical imaging and, more particularly, to a system and a method for diffusion group cycling or diffusion gradient group cycling during magnetic resonance imaging (MRI).

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During magnetic resonance imaging, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Long diffusion encoding gradients create significant stress for the semiconductors in the gradient amplifiers. To avoid overheating and/or intolerable repetition times (TRs), diffusion gradient cycling (all TRs cycling) was introduced that changes the diffusion encoding direction slice by slice (e.g., approximately every 100 milliseconds (ms)) and not volume by volume (e.g., approximately every 5 seconds(s)). The disadvantage of this approach is that the acquisition time of a single diffusion-weighted imaging (DWI) volume was spread across the entire diffusion scan (e.g., which last several minutes such as up to tens of minutes).

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a computer-implemented method for performing magnetic resonance diffusion weighted imaging of an object is provided. The computer-implemented method includes generating, via a processor, a diffusion weighted imaging sequence where all diffusion gradients are allocated into N groups such that all imaging slices are acquired for all the diffusion gradients corresponding to a group of the N groups back-to-back in $A_n$*TR, wherein N is two or larger, wherein $A_n$ is a number of diffusion gradients of each group of the N groups and TR is repetition time, and wherein in each TR every diffusion gradient of the group of the N groups is applied at least once. The computer-implemented method also includes acquiring, via the processor, imaging slices for multiple groups of the N groups utilizing the diffusion weighted imaging sequence during a scan of the object utilizing a magnetic resonance imaging scanner.

In another embodiment, a system for performing magnetic resonance diffusion weighted imaging of an object is provided. The system includes a memory encoding processor-executable routines. The system also includes a processor configured to access the memory and to execute the processor-executable routines, wherein the processor-executable routines, when executed by the processor, cause the processor to perform actions. The actions include generating a diffusion weighted imaging sequence where all diffusion gradients are allocated into N groups such that all imaging slices are acquired for all the diffusion gradients corresponding to a group of the N groups back-to-back in $A_n$*TR, wherein N is two or larger, wherein $A_n$ is a number of diffusion gradients of each group of the N groups and TR is repetition time, and wherein in each TR every diffusion gradient of the group of the N groups is applied at least once. The actions also include acquiring imaging slices for multiple groups of the N groups utilizing the diffusion weighted imaging sequence during a scan of the object utilizing a magnetic resonance imaging scanner.

In a further embodiment, a non-transitory computer-readable medium is provided. The non-transitory computer-readable medium includes processor-executable code that when executed by a processor, causes the processor to perform actions. The actions include generating a diffusion weighted imaging sequence where all diffusion gradients are allocated into N groups such that all imaging slices are acquired for all the diffusion gradients corresponding to a group of the N groups back-to-back in $A_n$*TR, wherein N is two or larger, wherein $A_n$ is a number of diffusion gradients of each group of the N groups and TR is repetition time, and wherein in each TR every diffusion gradient of the group of the N groups is applied at least once. The actions also include acquiring imaging slices for multiple groups of the N groups utilizing the diffusion weighted imaging sequence during a scan of an object utilizing a magnetic resonance imaging scanner.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

Figure 1:
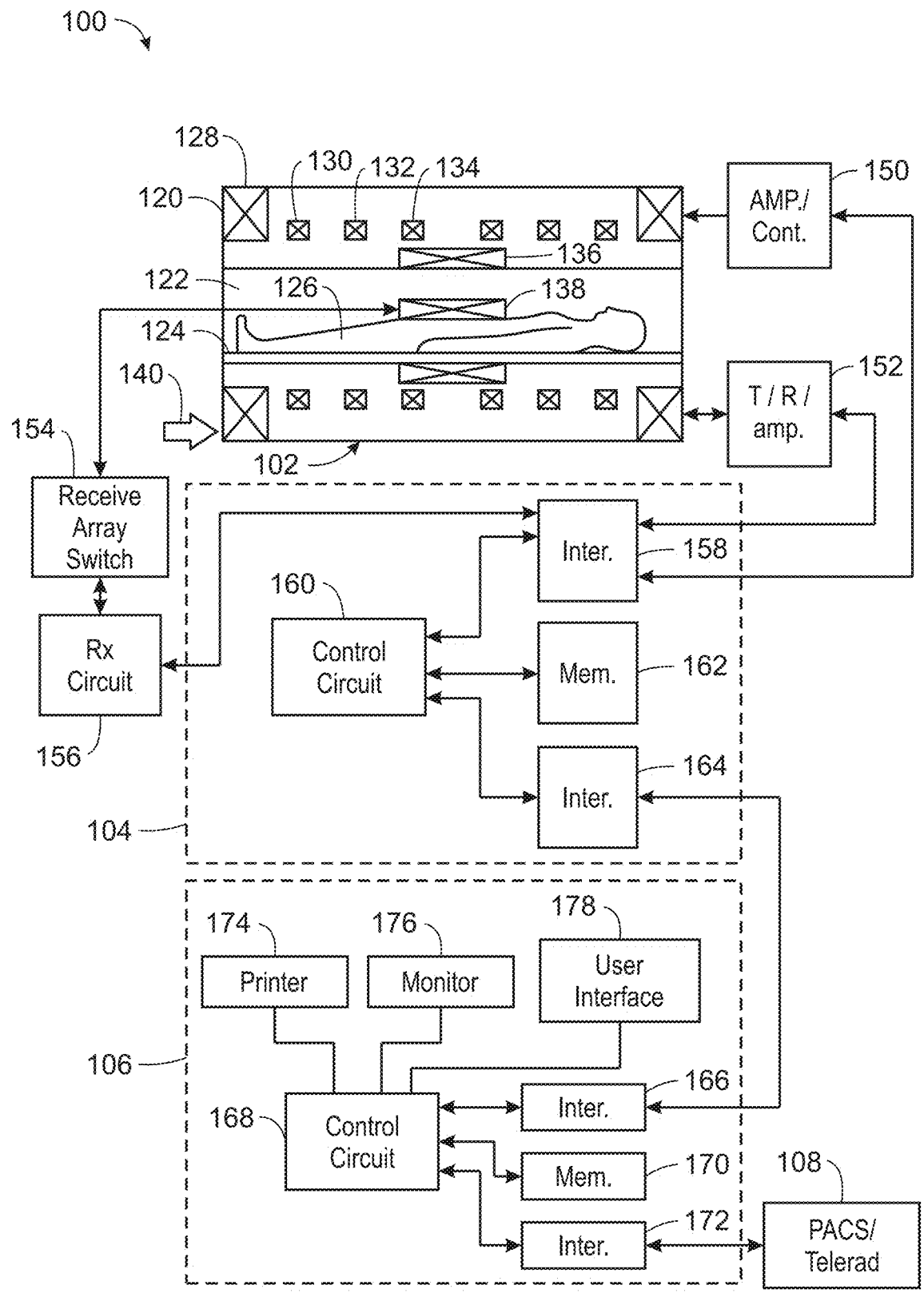
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

The present disclosure provides systems and methods for performing magnetic resonance diffusion weighted imaging of an object (e.g., patient or subject) utilizing diffusion group cycling or diffusion gradient group cycling. In diffusion group cycling diffusion encoding directions (or diffusion gradients) are organized in N groups, where all slices and directions of a group are acquired back-to-back. Diffusion group cycling maintains the load balancing feature of diffusion gradient cycling (all TRs cycling) but reduces the temporal footprint of each volume to the number of groups times the repetition time (TR) (as opposed to the entire scan with diffusion gradient cycling (all TRs cycling)). The repetition time achievable with diffusion group cycling is similar to all repetition times cycling implementations.

In certain embodiments, the systems and methods for performing magnetic resonance diffusion weighted imaging of an object include generating, via a processor, a diffusion weighted imaging sequence where all diffusion gradients are allocated into N groups such that all imaging slices are acquired for all the diffusion gradients corresponding to a group of the N groups back-to-back in $A_n$*TR. The N groups include two or more groups. $A_n$ is the number of diffusion gradients of each group of the N groups and TR is repetition time. In each TR every diffusion gradient of the group of the N groups is applied at least once. The systems and methods also include acquiring, via the processor, imaging slices for multiple groups of the N groups utilizing the diffusion weighted imaging sequence during a scan of the object utilizing a magnetic resonance imaging scanner.

In certain embodiments, $A_n$*TR is less than a total time of scan. In certain embodiments, $A_n$ includes two diffusion gradients and respective encoding directions of the two diffusion gradients are perpendicular with respect to each other. In certain embodiments, $A_n$ includes three diffusion gradients and respective encoding directions of the three diffusion gradients are perpendicular with respect to each other. In certain embodiments, some groups of the N groups include diffusion gradients with different b-values. In certain embodiments, each group of the N groups includes diffusion gradients having at least two perpendicular encoding directions and at least two different b-values.

In certain embodiments, the systems and methods include, prior to generating the diffusion weighted imaging sequence, selecting, via the processor, respective diffusion gradients from among all the diffusion gradients for each group of the N groups utilizing an algorithm that minimizes cost function. In certain embodiments, the algorithm is configured to sum all absolute values of inner products of the respective diffusion gradients for each possible group of the N groups and to select a highest value sum from among all possible groups of the N groups as the cost function. In certain embodiments, the algorithm is configured to sum all absolute values of inner products of the respective diffusion gradients for each possible group of the N groups, to calculate a sum of squares of the respective diffusion gradients for each possible group of the N groups, and to sum both the sum of all absolute values of the inner products and the sum of squares for each possible group of the N groups. The algorithm is then configured to select a highest sum value of the sum of all absolute values of the inner products and the sum of squares from among all possible groups of the N groups as the cost function.

Diffusion group cycling significantly reduces the motion sensitivity compared to diffusion gradient cycling (all TRs cycling). With diffusion gradient cycling (all TRs cycling), a single patient motion would corrupt all volumes. With diffusion group cycling, a single patient motion affects only the $A_n$ volumes of a group (e.g., two or three). In addition, state of the art motion correction algorithms are incompatible with diffusion gradient cycling (all TRs cycling), while diffusion gradient cycling with groups of two or three repetition times works (diffusion group cycling) with the state of the art motion correction algorithms. Compared to diffusion gradient cycling (all TRs cycling), diffusion group cycling optimizes for both gradient hardware load balancing and minimization of the temporal footprint of a volume. Also, the disclosed embodiments allow for more robust diffusion imaging. Diffusion gradient cycling (all TRs cycling) is compatible with the guidelines of large multi-center diffusion studies due to compatibility with post processing pipelines.

With the preceding in mind, FIG. 1 a magnetic resonance imaging (MRI) system 100 is illustrated schematically as including a scanner 102, scanner control circuitry 104, and system control circuitry 106. According to the embodiments described herein, the magnetic resonance imaging system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the magnetic resonance imaging system 100 may include any suitable scanner or detector, in the illustrated embodiment, the system 100 includes a full body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., radio frequency transmit coil) is configured to generate radio frequency pulses for exciting the certain gyromagnetic nuclei within the patient. In addition to the coils that may be local to the scanner 102, the system 100 also includes a set of receiving coils or radio frequency receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak radio frequency signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, $B_0$. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the radio frequency coil 136. Circuit 152 includes a switching device for alternating between the active and inactive modes of operation, wherein the radio frequency coil 136 transmits and does not transmit signals, respectively. Circuit 152 also includes amplification circuitry configured to generate the radio frequency pulses. Similarly, the receiving coils 138 are connected to switch 154, which is capable of switching the receiving coils 138 between receiving and non-receiving modes. Thus, the receiving coils 138 resonate with the radio frequency signals produced by relaxing gyromagnetic nuclei from within the patient 126 while in the receiving mode, and they do not resonate with radio frequency energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the radio frequency coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the magnetic resonance imaging system 100 and to store the processed image data for later reconstruction, display and transmission. The programming code may execute one or more algorithms that, when executed by a processor, are configured to perform reconstruction of acquired data as described below. In certain embodiments, image reconstruction may occur on a separate computing device having processing circuitry and memory circuitry.

As described in greater detail below, the programming code is configured to perform magnetic resonance diffusion weighted imaging of an object. In particular, the programming code is configured to generate a diffusion weighted imaging sequence where all diffusion gradients are allocated into N groups such that all imaging slices are acquired for all the diffusion gradients corresponding to a group of the N groups back-to-back in $A_n$*TR. The N groups include two or more groups. $A_n$ is the number of diffusion gradients of each group of the N groups and TR is repetition time. In each TR every diffusion gradient of the group of the N groups is applied at least once. The programming code is also configured to acquire imaging slices for multiple groups of the N groups utilizing the diffusion weighted imaging sequence during a scan of the object utilizing a magnetic resonance imaging scanner.

In certain embodiments, $A_n$*TR is less than a total time of scan. In certain embodiments, $A_n$ includes two diffusion gradients and respective encoding directions of the two diffusion gradients are perpendicular with respect to each other. In certain embodiments, $A_n$ includes three diffusion gradients and respective encoding directions of the three diffusion gradients are perpendicular with respect to each other. In certain embodiments, some groups of the N groups include diffusion gradients with different b-values. In certain embodiments, each group of the N groups includes diffusion gradients having at least two perpendicular encoding directions and at least two different b-values.

In certain embodiments, the programming code is further configured, prior to generating the diffusion weighted imaging sequence, to select respective diffusion gradients from among all the diffusion gradients for each group of the N groups utilizing an algorithm that minimizes cost function. In certain embodiments, the algorithm is configured to sum all absolute values of inner products of the respective diffusion gradients for each possible group of the N groups and to select a highest value sum from among all possible groups of the N groups as the cost function. In certain embodiments, the algorithm is configured to sum all absolute values of inner products of the respective diffusion gradients for each possible group of the N groups, to calculate a sum of squares of the respective diffusion gradients for each possible group of the N groups, and to sum both the sum of all absolute values of the inner products and the sum of squares for each possible group of the N groups. The algorithm is then configured to select a highest sum value of the sum of all absolute values of the inner products and the sum of squares from among all possible groups of the N groups as the cost function.

In certain embodiment, the programming code is configured (when grouping the diffusion gradients) to initially allocate all diffusion gradients (e.g. diffusion directions) to N groups. The programming code may also be configured to compute the sum of all absolute values of inner products of the respective diffusion gradients for each possible group of the N groups. The programming code may further be configured to identify the group with the highest value of the sum of the absolute values of the inner products of the respective diffusion gradients or diffusion directions as the worst case group. The programming code may even further be configured to determine the value of the cost function for the identified worst case group. The programming code may yet further include taking one or two diffusion gradients or two diffusion directions from the identified worst case group and swapping them with other diffusion gradients or diffusion directions from another group. In certain embodiments, the swapping partner or swapping group to swap diffusion directions with the identified worst case group is randomly chosen. In certain embodiments, the swapping partner or swapping group to swap diffusion directions with the identified worst case group is chosen in a systematic manner. The programming code may further be configured to redetermine the value of the cost function for the identified worst case group (with the one or two swapped diffusion directions or diffusion gradients). If the value of the redetermined cost function is not smaller than the previously determined cost function for the identified worst case group, the programming code may be configured to repeat both swapping (utilizing a different group as swapping partner) and redetermining the value of the cost function for the identified worst case group (with the one or two swapped diffusion directions or diffusion gradients). If the value of the redetermined cost function is smaller than the previously determined cost function for the identified worst case group, the programing code may be configured to determine a new worst case group from among the groups and to repeat both swapping (for the new worst case group) and redetermining the value of the cost function for the identified new worst case group (with the one or two swapped diffusion directions or diffusion gradients).

In certain embodiment, the programming code is configured (when grouping the diffusion gradients) to initially allocate all diffusion gradients (e.g. diffusion directions) to N groups. The programming code may also be configured to compute the sum of all absolute values of the inner products of the respective diffusion gradients for each possible group of the N groups. The programming code may further be configured to compute the sum of squares of all diffusion gradients in each group. The sum of squares minimizes amplifier specific load and total system load. The programming code may further be configured to sum both the sum of the absolute values and the sum of squares for each group. The programming code may even further be configured to identify the group with the highest value of the sum of both the sum of the absolute values of the respective diffusion gradients or diffusion directions and the sum of squares as the worst case group. The programming code may yet further be configured to determine the value of the cost function for the identified worst case group. The programing code may also be configured to take one or two diffusion gradients or two diffusion directions from the identified worst case group and swapping them with other diffusion gradients or diffusion directions from another group. In certain embodiments, the swapping partner or swapping group to swap diffusion directions with the identified worst case group is randomly chosen. In certain embodiments, the swapping partner or swapping group to swap diffusion directions with the identified worst case group is chosen in a systematic manner. The programming code may be further configured to redetermine the value of the cost function for the identified worst case group (with the one or two swapped diffusion directions or diffusion gradients). If the value of the redetermined cost function is not smaller than the previously determined cost function for the identified worst case group, the programming code may be configured to repeat both swapping (utilizing a different group as swapping partner) and redetermining the value of the cost function for the identified worst case group (with the one or two swapped diffusion directions or diffusion gradients) If the value of the redetermined cost function is smaller than the previously determined cost function for the identified worst case group, the programing code may be configured to determine a new worst case group from among the groups and to repeat both swapping (for the new worst case group) and redetermining the value of the cost function for the identified new worst case group (with the one or two swapped diffusion directions or diffusion gradients).

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images.

In the illustrated embodiment, these peripherals include a printer 174, a monitor 176, and user interface 178 including devices such as a keyboard, a mouse, a touchscreen (e.g., integrated with the monitor 176), and so forth.

Figure 2:
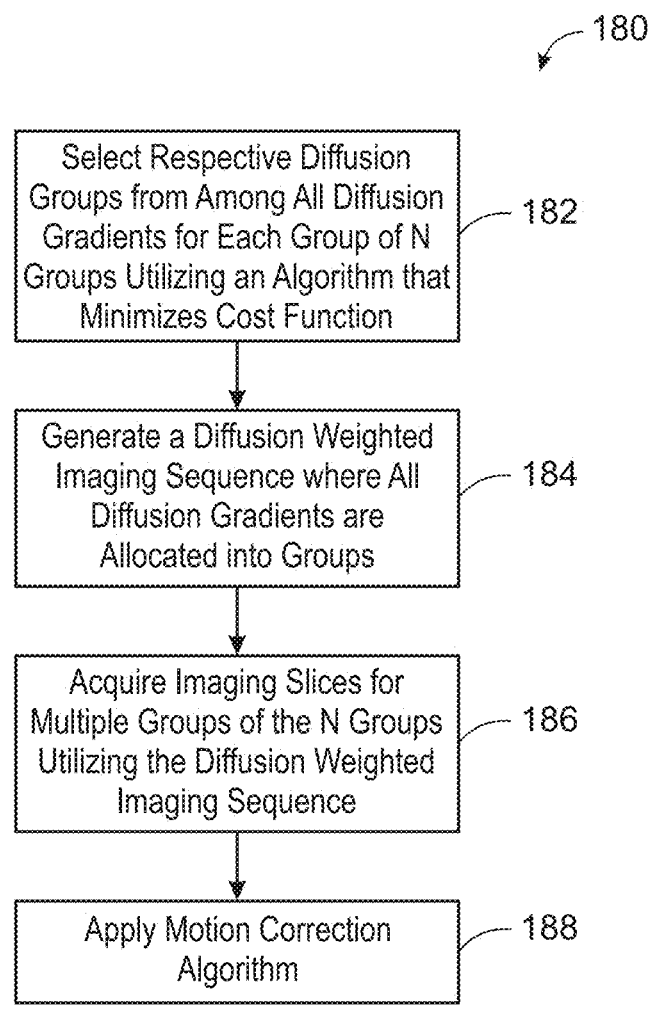
FIG. 2 is a flow chart of a method for performing magnetic resonance diffusion weighted imaging of an object (e.g., diffusion group cycling), in accordance with aspects of the present disclosure.

FIG. 2 is a flow chart of a method 180 for performing magnetic resonance diffusion weighted imaging of an object (e.g., diffusion group cycling). One or more steps of the method 180 may be performed by processing circuitry of the magnetic resonance imaging system 100 in FIG. 1 or a remote computing system. For example, the processing circuitry may part of the scanner control circuitry 104 and/or system control circuitry 106 of the magnetic resonance imaging system 100. One or more steps of the method 180 may be performed simultaneously and/or in a different order shown in FIG. 2.

The method 180 includes (prior to generating a diffusion weighted imaging sequence) selecting respective diffusion gradients from among all diffusion gradients for each group of N groups utilizing an algorithm that minimizes cost function (block 182). The N groups includes two or more groups. In certain embodiments, the algorithm is configured to sum all absolute values of inner products of the respective diffusion gradients for each possible group of the N groups and to select a highest value sum from among all possible groups of the N groups as the cost function. In certain embodiments, the algorithm is configured to sum all absolute values of inner products of the respective diffusion gradients for each possible group of the N groups, to calculate a sum of squares of the respective diffusion gradients for each possible group of the N groups, and to sum both the sum of all absolute values of the inner products and the sum of squares for each possible group of the N groups. The algorithm is then configured to select a highest sum value of the sum of the sum of all absolute values of the inner products and the sum of squares from among all possible groups of the N groups as the cost function.

The criteria to grouping the diffusion gradients is precomputed as noted above in block 182 of the method 180. Perpendicularity is utilized as one criteria. In particular, having the diffusion directions of a pair of diffusion gradients be perpendicular optimizes alignment of the diffusion gradients. This perpendicularity is rotation invariant (i.e., independent of a logical coordinate shell).

In certain embodiments (only those involving multi shell), diffusion amplitude is considered. In a physical coordinate system, for each diffusion group and for each physical axis (or gradient driver), a sum squared gradient strength of the echo-planar imaging train and diffusion gradients is obtained. In certain embodiments, quadratic weighting of diffusion amplitudes is performed. The worst case group is the groups with the highest root mean square value of the gradient (GRMS) on any axis.

The method 180 also includes generating a diffusion weighted imaging sequence where all diffusion gradients are allocated into N groups such that all imaging slices are acquired for all the diffusion gradients corresponding to a group of the N groups back-to-back in $A_n*TR$ (block 184). The N groups include two or more groups. $A_n$ is the number of diffusion gradients of each group of the N groups. TR is repetition time. In each TR every diffusion gradient of the group of the N groups is applied at least once. The number of diffusion gradients may vary.

$A_n*TR$ is less than a total time of scan. In certain embodiments, $A_n$ includes two diffusion gradients and respective encoding directions of the two diffusion gradients are perpendicular with respect to each other. In certain embodiments, $A_n$ includes three diffusion gradients and respective encoding directions of the three diffusion gradients are perpendicular with respect to each other. In certain embodiments, some groups of the N groups include diffusion gradients with different b-values. In certain embodiments, each group of the N groups includes diffusion gradients having at least two perpendicular encoding directions and at least two different b-values.

Figure 3:
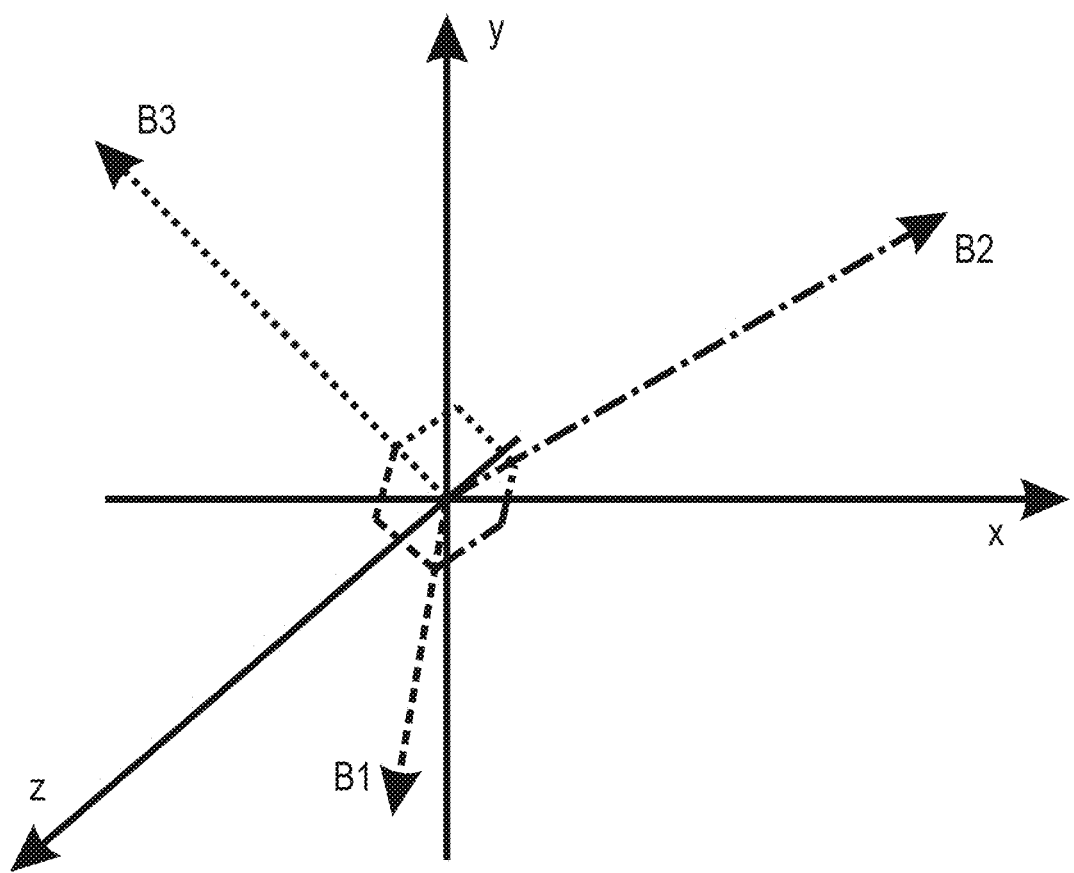
FIG. 3 is a schematic diagram depicting diffusion directions relative to an amplifier axis, in accordance with aspects of the present disclosure.

The N groups in the diffused weighted imaging sequence provide load balancing. FIG. 3 is a schematic diagram depicting diffusion directions relative to an amplifier axis. In particular, three perpendicular diffusion vectors (B1, B2, and B3) are shown relative to an x, y, z physical amplifier axis. No matter how the three perpendicular diffusion vectors are rotated, the root mean square of the projections B1→x, B2→x, and B3→x is constant. The same is true for y and z. The load balancing should be perfect for three consecutive waveforms. In particular, root mean square value of the current (IRMS) and heat dissipation should be the same for any set of three orthogonal diffusion directions.

Returning to FIG. 2, the method 180 further includes acquiring imaging slices for multiple groups of the N groups utilizing the diffusion weighted imaging sequence during a scan of an object utilizing a magnetic resonance imaging scanner (block 186). In certain embodiments, the method 180 even further includes applying motion correction algorithm to the acquired imaging slices to correct for any motion and to generate motion corrected imaging slices (block 188). Any number of state of the art motion correction algorithm may be utilized on the acquired imaging slices.

Figure 4:
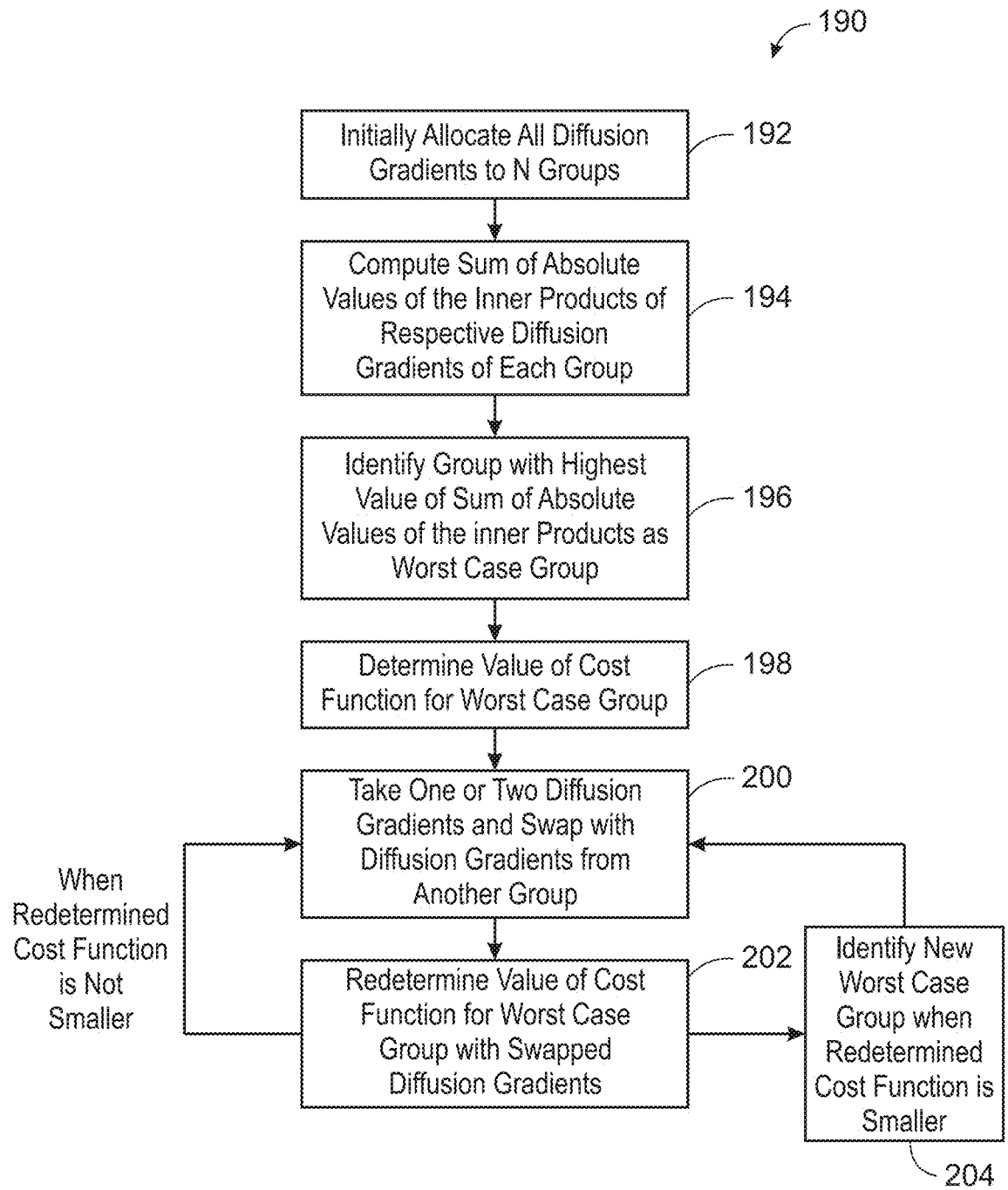
FIG. 4 is a flow chart of a method for an algorithm grouping diffusion gradients for diffusion group cycling (e.g., utilizing sum of absolute values of inner products between all diffusion directions of a group), in accordance with aspects of the present disclosure.

FIG. 4 is a flow chart of a method 190 for an algorithm grouping diffusion gradients for diffusion group cycling (e.g., utilizing sum of absolute values). One or more steps of the method 190 may be performed by processing circuitry of the magnetic resonance imaging system 100 in FIG. 1 or a remote computing system. For example, the processing circuitry may part of the scanner control circuitry 104 and/or system control circuitry 106 of the magnetic resonance imaging system 100. One or more steps of the method 190 may be performed simultaneously and/or in a different order shown in FIG. 4. The method 190 occurs prior to performing magnetic resonance diffusion weighted imaging of an object utilizing diffusion group cycling.

The method 190 includes initially allocate all diffusion gradients (e.g. diffusion directions) to N groups (block 192). The method 190 also includes computing the sum of the absolute values of the inner products of the respective diffusion gradients or diffusion directions of each group (block 194). For example, for 2TR cycling with two diffusion gradients or diffusion directions per group of the N groups, the absolute value of the inner product of the two respective diffusion gradients in each group is calculated as represented by the following equation:

$$\text{abs(inner\_product}(A,B)), \qquad (1)$$

where A and B represent the two respective diffusion gradients for each group. For example, for 2TR cycling with three diffusion gradients or diffusion directions per group of the N groups, the sum of the absolute values of the inner products between the different combinations of the three respective diffusion gradients in each group is calculated as represented by the following equation:

$$\text{abs(inner\_product}(A,B))+\text{abs(inner\_product}(A,C))+\text{abs}\\\text{(inner\_product }B,C), \qquad (2)$$

where A, B, and C represent the three respective diffusion gradients for each group.

The method 190 further includes identifying the group with the highest value of the sum of the absolute values of the inner products of the respective diffusion gradients or diffusion directions as the worst case group (block 196). The method 190 even further includes determining the value of the cost function for the identified worst case group (block 198).

The method 190 still further includes taking one or two diffusion gradients or two diffusion directions from the identified worst case group and swapping them with other diffusion gradients or diffusion directions from another group (block 200). In certain embodiments, the swapping partner or swapping group to swap diffusion directions with the identified worst case group is randomly chosen. In certain embodiments, the swapping partner or swapping group to swap diffusion directions with the identified worst case group is chosen in a systematic manner. The method 190 includes redetermining the value of the cost function for the identified worst case group (with the one or two swapped diffusion directions or diffusion gradients) (block 202). If the value of the redetermined cost function is not smaller than the previously determined cost function for the identified worst case group, the method 190 includes repeating blocks 200 and 202 utilizing a different group as swapping partner. If the value of the redetermined cost function is smaller than the previously determined cost function for the identified worst case group, the method 190 includes identifying a new worst case group from among the groups (block 204) and repeating blocks 200 and 202 for the new worst case group. The steps of the method are repeated for a set number of iteration (e.g., 10,000 iterations).

Figure 5:
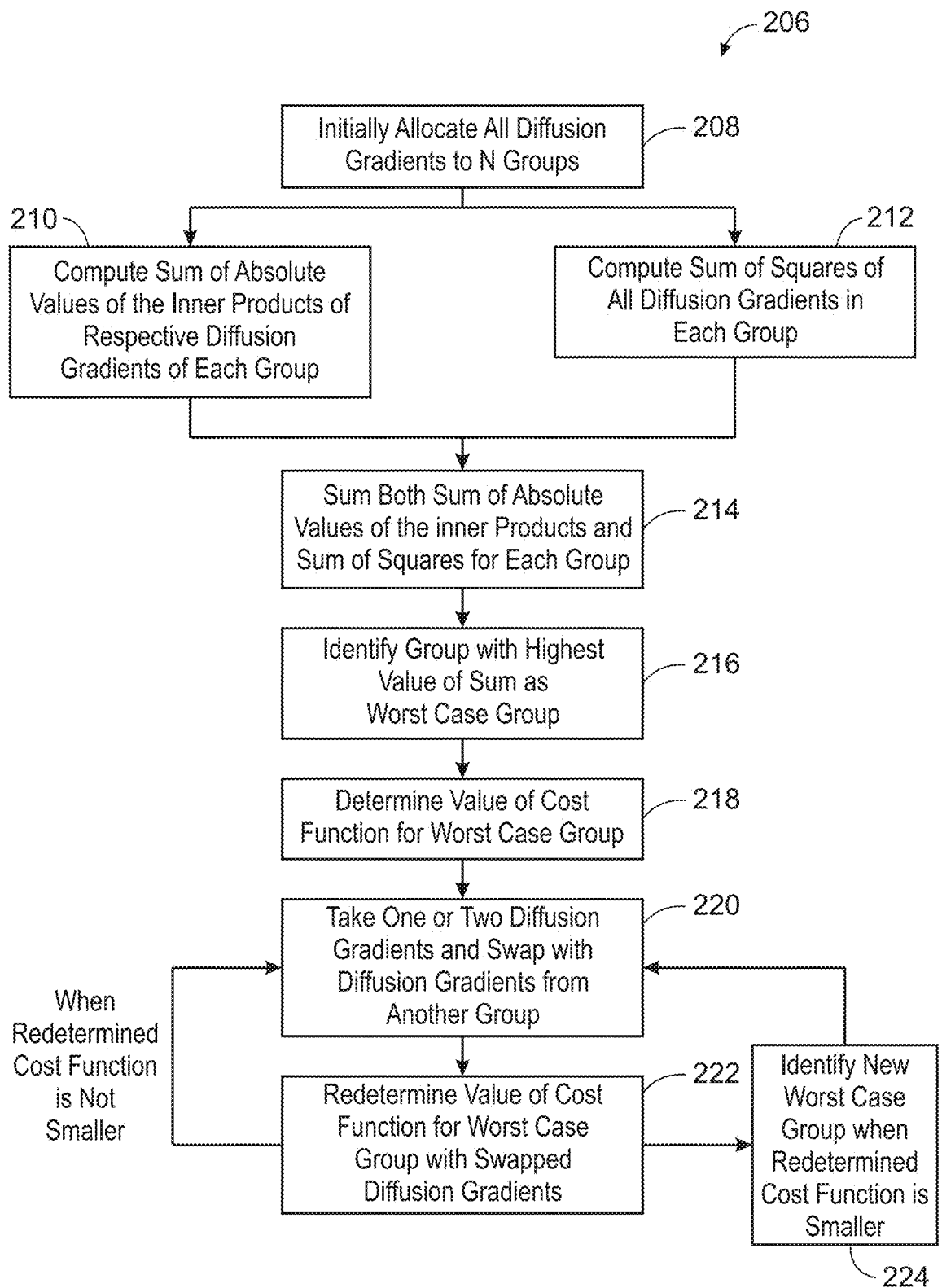
FIG. 5 is a flow chart of a method for an algorithm grouping diffusion gradients for diffusion group cycling (e.g., utilizing sum of both sum of absolute values of inner products and sum of squares), in accordance with aspects of the present disclosure.

FIG. 5 is a flow chart of a method 206 for an algorithm grouping diffusion gradients for diffusion group cycling (e.g., utilizing sum of both sum of absolute values and sum of squares). One or more steps of the method 206 may be performed by processing circuitry of the magnetic resonance imaging system 100 in FIG. 1 or a remote computing system. For example, the processing circuitry may part of the scanner control circuitry 104 and/or system control circuitry 106 of the magnetic resonance imaging system 100. One or more steps of the method 206 may be performed simultaneously and/or in a different order shown in FIG. 5. The method 206 occurs prior to performing magnetic resonance diffusion weighted imaging of an object utilizing diffusion group cycling.

The method 206 includes initially allocate all diffusion gradients (e.g. diffusion directions) to N groups (block 208). The method 206 also includes computing the sum of the absolute values of the inner products of the respective diffusion gradients or diffusion directions of each group (block 210). For example, for 2TR cycling with two diffusion gradients or diffusion directions per group of the N groups, the absolute value of the inner product of the two respective diffusion gradients in each group is calculated as represented by the following equation:

$$\text{abs}(\text{inner\_product}(A,B)), \quad (1)$$

where A and B represent the two respective diffusion gradients for each group. For example, for 2TR cycling with three diffusion gradients or diffusion directions per group of the N groups, the sum of the absolute values of the inner products between the different combinations of the three respective diffusion gradients in each group is calculated as represented by the following equation:

$$\text{abs}(\text{inner\_product}(A,B)) + \text{abs}(\text{inner\_product}(A,C)) + \text{abs}(\text{inner\_product}(B,C)), \quad (2)$$

where A, B, and C represent the three respective diffusion gradients for each group. The method 206 still further includes computing the sum of squares of all diffusion gradients in each group (block 212). The sum of squares minimizes amplifier specific load and total system load. The method 206 also includes summing both the sum of the absolute values and the sum of squares for each group (block 214).

The method 206 further includes identifying the group with the highest value of the sum of both the sum of the absolute values of the respective diffusion gradients or diffusion directions and the sum of squares as the worst case group (block 216). The method 206 even further includes determining the value of the cost function for the identified worst case group (block 218).

The method 206 still further includes taking one or two diffusion gradients or two diffusion directions from the identified worst case group and swapping them with other diffusion gradients or diffusion directions from another group (block 220). In certain embodiments, the swapping partner or swapping group to swap diffusion directions with the identified worst case group is randomly chosen. In certain embodiments, the swapping partner or swapping group to swap diffusion directions with the identified worst case group is chosen in a systematic manner. The method 206 includes redetermining the value of the cost function for the identified worst case group (with the one or two swapped diffusion directions or diffusion gradients) (block 222). If the value of the redetermined cost function is not smaller than the previously determined cost function for the identified worst case group, the method 206 includes repeating blocks 220 and 222 utilizing a different group as swapping partner. If the value of the redetermined cost function is smaller than the previously determined cost function for the identified worst case group, the method 206 includes identifying a new worst case group from among the groups (block 224) and repeating blocks 220 and 222 for the new worst case group. The steps of the method are repeated for a set number of iteration (e.g., 10,000 iterations).

Figure 6:
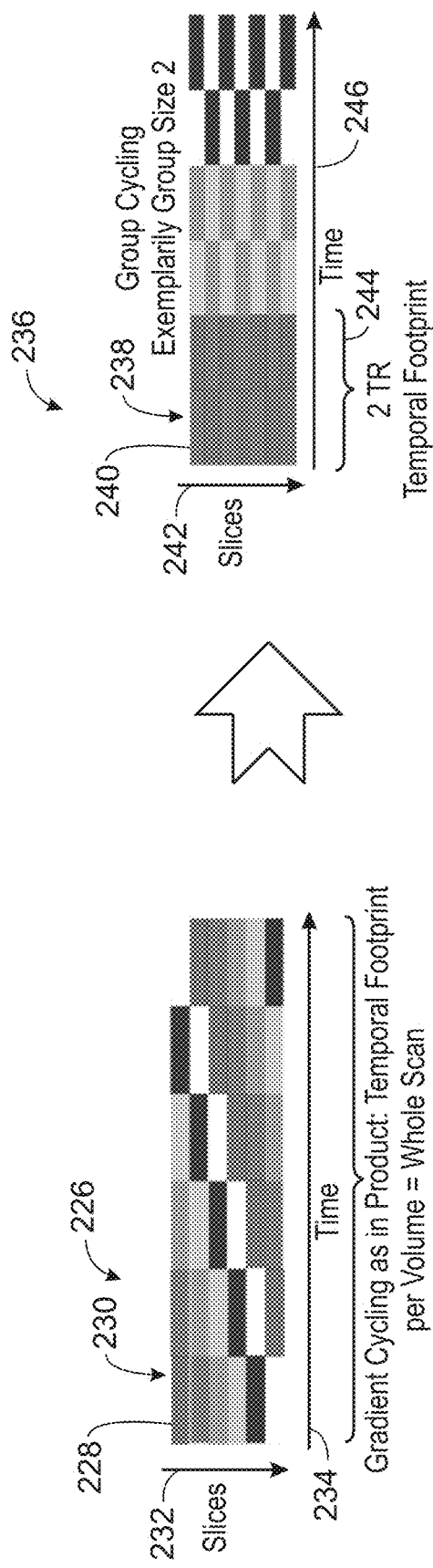
FIG. 6 is a schematic diagram depicting a profile of gradient cycling (e.g., all repetition times (TRs) cycling) compared to a profile of diffusion gradient group cycling (e.g., 2TRs cycling), in accordance with aspects of the present disclosure.

FIG. 6 is a schematic diagram depicting a profile of gradient cycling (e.g., all repetition times (TRs) cycling) compared to a profile of diffusion gradient group cycling (e.g., 2TRs cycling). The examples in FIG. 6 assumes six different diffusion gradients or diffusion directions. The number of diffusion gradients or diffusion directions may vary. Each different color represents imaging slices for a respective diffusion volume for a different diffusion gradient or diffusion direction. Schematic 226 represents the acquisition of imaging slices over time for all TRs cycling. Each box 228 represents an imaging slice. Each column 230 represents a repetition time (TR). Arrow 232 represents imaging slices for a TR and arrow 234 represents time for the entire scan. As depicted in schematic 226, for each TR, imaging slices are acquired for all diffusion gradients or diffusion directions. In addition, as depicted in schematic 226, the imaging slices collected for all of the TRs for a respective diffusion gradient or diffusion direction are utilized for a respective acquisition volume for each diffusion volume. In other words, the temporal footprint for a respective acquisition volume is the time for the entire scan.

Schematic 236 represents the acquisition of imaging slices over time for 2TR cycling. Each column 238 represents a repetition time (TR). Each box 240 represents an imaging slice. Arrow 242 represents imaging slices for a TR and arrow 246 represents time for the entire scan. Each 2TR 244 represents a different group. As depicted, there three different groups for the whole scan. All of the different diffusion gradients or the diffusion directions are allocated between the different groups. Each group has two different diffusion directions or diffusion gradients from among all of the diffusion directions or diffusion gradients. As depicted in schematic 236, for each 2TRs imaging slices are acquired for two different diffusion gradients or diffusion directions. The two different directions are perpendicular with respect to each other. Each of the two diffusion gradients are repeated back-to-back in each TR of the 2TR. In certain embodiments, the two diffusion gradients may have different b-values in a respective group. In certain embodiments, one or more of the groups may include diffusion gradients with different b-values within a respective group. In addition, as depicted in schematic 236, the imaging slices collected for 2TRs for a respective diffusion gradient or diffusion direction (i.e., the respective two different diffusion gradients or diffusion directions) are utilized for a respective acquisition volume for each diffusion volume. The temporal footprint for a respective acquisition volume (for a respective diffusion volume) in 2TRs cycling is significantly shorter than the temporal footprint during all TRs cycling.

Figure 7:
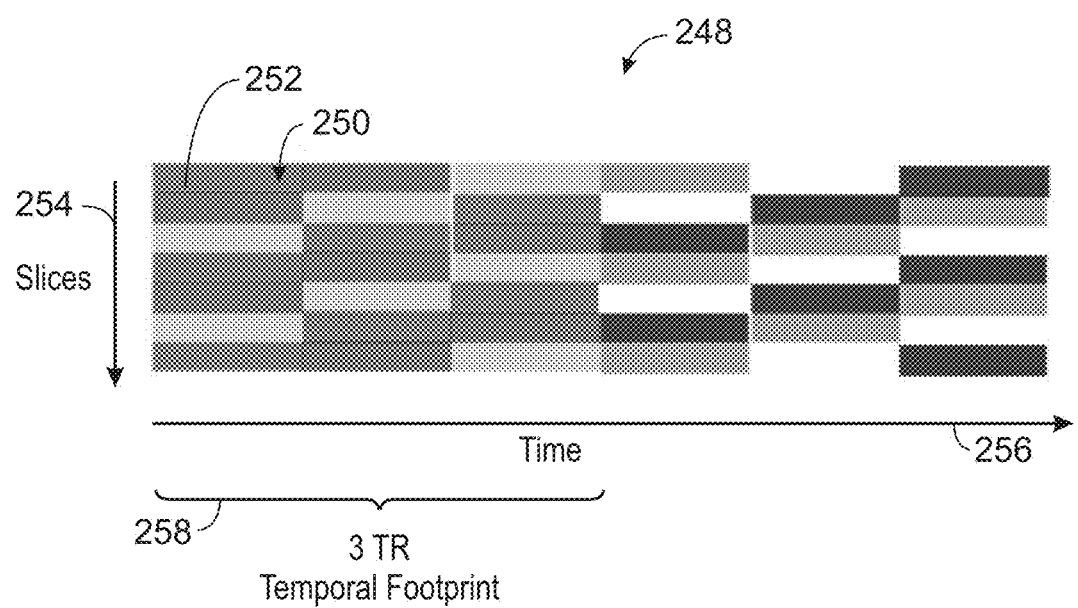
FIG. 7 is a schematic diagram depicting a profile of diffusion gradient group cycling (e.g., 3TRs cycling), in accordance with aspects of the present disclosure.

FIG. 7 is a schematic diagram depicting a profile of diffusion gradient group cycling (e.g., 3TRs cycling). The example in FIG. 7 assumes six different diffusion gradients or diffusion directions. The number of diffusion gradients or diffusion directions may vary. Each different color represents imaging slices for a respective diffusion volume for a different diffusion gradient or diffusion direction.

Schematic 248 represents the acquisition of imaging slices over time for 2TR cycling. Each column 250 represents a repetition time (TR). Each box 252 represents an imaging slice. Arrow 254 represents imaging slices for a TR and arrow 256 represents time for the entire scan. Each 3TR 258 represents a different group. As depicted, there two different groups for the whole scan. All of the different diffusion gradients or the diffusion directions are allocated between the different groups. Each group has three different diffusion directions or diffusion gradients from among all of the diffusion directions or diffusion gradients. As depicted in schematic 248, for each 3TRs imaging slices are acquired for three different diffusion gradients or diffusion directions. The three different directions are perpendicular with respect to each other. Each of the three diffusion gradients are repeated back-to-back in each TR of the 3TR. In certain embodiments, at least two of the three diffusion gradients may have different b-values in a respective group. In certain embodiments, all three diffusion gradients may have different b-values in a respective group. In certain embodiments, one or more of the groups may include diffusion gradients with at least two diffusion gradients having different b-values within a respective group. In addition, as depicted in schematic 248, the imaging slices collected for 3TRs for a respective diffusion gradient or diffusion direction (i.e., the respective two different diffusion gradients or diffusion directions) are utilized for a respective acquisition volume for each diffusion volume. The temporal footprint for a respective acquisition volume (for a respective diffusion volume) in 3TRs cycling is significantly shorter than the temporal footprint during all TRs cycling (shown in FIG. 6).

The best possible outcome for 2TRs cycling reduces IRMS by 1/(square root of 2). The best possible outcome for 3TRs cycling reduces IRMS by 1/(square root of 3). 3TRs cycling is geometrically optimal and provides the best load balancing for single shell. However, 3TRs cycling is more susceptible to motion artifacts compared to 2TRs cycling.

Figure 8:
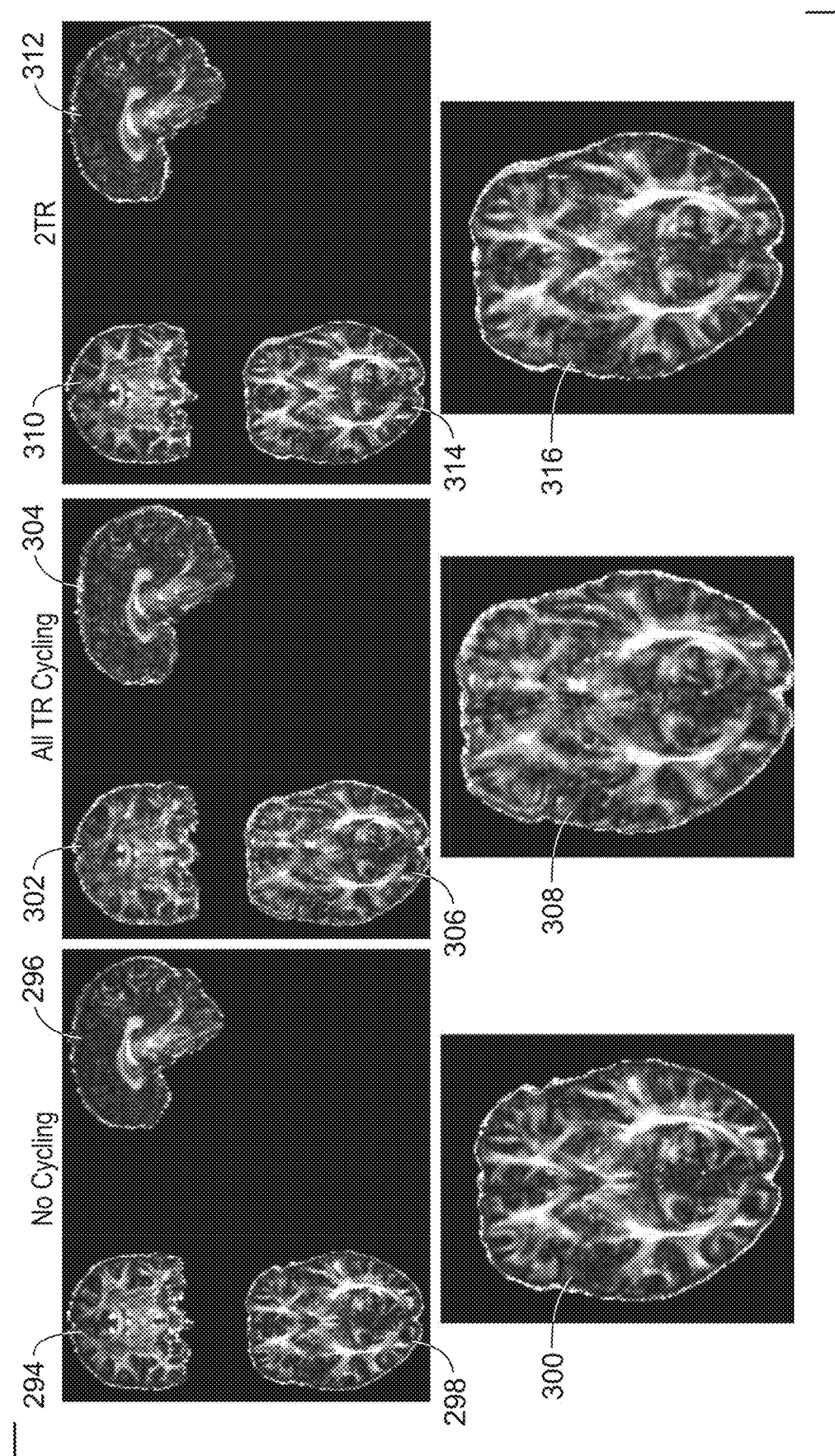
FIG. 8 depicts magnetic resonance images acquired utilizing different types of cycling, in accordance with aspects of the present disclosure.

FIG. 8 depicts magnetic resonance images (e.g., MR diffusion weighted images) acquired utilizing different types of cycling. The images were acquired of a brain of a subject. Three different types of MR diffusion weighted imaging acquisitions were conducted on a subject: cycling off (no cycling), all TRs cycling, and 2TRs cycling. Each of the acquisitions was done with the following criteria: 42 diffusion direction at b=1000 and 1 $b_0$. The acquisitions were done on the head of the subject at three different poses spaced apart at 2 minute intervals and retrospective motion correction was applied.

Images 294, 296, and 298 are coronal, sagittal, and axial MR diffusion weighted images of the brain of the subject. Image 300 is the larger version of the axial MR diffusion weighted image 298. The images 294, 296, 298, and 300 were acquired with no cycling. The images 294, 296, 298, and 300 are fractional anisotropy images.

Images 302, 304, and 306 are coronal, sagittal, and axial MR diffusion weighted images of the brain of the subject. Image 308 is the larger version of the axial MR diffusion weighted image 306. The images 302, 304, 306, and 308 were acquired with all TRs cycling. The images 302, 304, 306, and 308 are fractional anisotropy images.

Images 310, 312, and 314 are coronal, sagittal, and axial MR diffusion weighted images of the brain of the subject. Image 316 is the larger version of the axial MR diffusion weighted image 314. The images 310, 312, 314, and 316 were acquired with 2TRs cycling. The images 310, 312, 314, and 316 are fractional anisotropy images.

The images 310, 312, 314, and 316 acquired with 2TRs cycling have similar image quality to the images 294, 296, 298, and 300 acquired with no cycling. The images 302, 304, 306, and 308 acquired with all TRs cycling are unsharp and have motion artifacts compared both to the images 294, 296, 298, and 300 acquired with no cycling and the images 310, 312, 314, and 316 acquired with 2TRs cycling.

Technical effects of the disclosed subject matter include provides systems and methods for performing magnetic resonance diffusion weighted imaging of an object (e.g., patient or subject) utilizing diffusion group cycling. Technical effects of the disclosed subject matter also include maintaining the load balancing feature of diffusion gradient cycling (all TRs cycling) but reducing the temporal footprint of each volume to the number of groups times the repetition time (TR) (as opposed to the entire scan with diffusion gradient cycling (all TRs cycling)). The repetition time achievable with diffusion group cycling is similar to all repetition times cycling implementations. Technical effects of the disclosed subject matter further include significantly reducing the motion sensitivity compared to diffusion gradient cycling. With diffusion gradient cycling, a single patient motion would corrupt all volumes. With diffusion group cycling, a single patient motion affects only N volumes (e.g., two or three). In addition, state of the art motion correction algorithms are incompatible with diffusion gradient cycling (all TRs cycling), while diffusion gradient cycling with groups of two or three repetition times (diffusion gradient group cycling) works the state of the art motion correction algorithms. Technical effects of the disclosed subject matter further include optimizing for both gradient hardware load balancing minimization of the temporal footprint of a volume. Technical effects of the disclosed subject matter also include allowing for more robust diffusion imaging. Technical effects of the disclosed subject matter further include being compatible with the guidelines of large multi-center diffusion studies due to compatibility with post processing pipelines.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112 (f). However, for any claims containing elements designated in any other manner, it is intended that such elements are not to be interpreted under 35 U.S.C. 112 (f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method for performing magnetic resonance diffusion weighted imaging of an object, comprising:
generating, via a processor, a diffusion weighted imaging sequence where all diffusion gradients are allocated into N groups such that all imaging slices are acquired for all the diffusion gradients corresponding to a group of the N groups back-to-back in $A_n$*TR, wherein N is two or larger, wherein $A_n$ is a number of diffusion gradients of each group of the N groups and TR is repetition time, and wherein in each TR every diffusion gradient of the group of the N groups is applied at least once; and
acquiring, via the processor, imaging slices for multiple groups of the N groups utilizing the diffusion weighted imaging sequence during a scan of the object utilizing a magnetic resonance imaging scanner.

2. The computer-implemented method of claim 1, wherein $A_n$*TR is less than a total time for the scan.

3. The computer-implemented method of claim 1, wherein $A_n$ comprises two diffusion gradients and respective encoding directions of the two diffusion gradients are perpendicular with respect to each other.

4. The computer-implemented method of claim 1, wherein $A_n$ comprises three diffusion gradients and respective encoding directions of the three diffusion gradients are perpendicular with respect to each other.

5. The computer-implemented method of claim 1, wherein some groups of the N groups comprise diffusion gradients with different b-values.

6. The computer-implemented method of claim 1, wherein each group of the N groups comprises diffusion gradients having at least two perpendicular encoding directions and at least two different b-values.

7. The computer-implemented method of claim 1, further comprising, prior to generating the diffusion weighted imaging sequence, selecting, via the processor, respective diffusion gradients from among all the diffusion gradients for each group of the N groups utilizing an algorithm that minimizes cost function.

8. The computer-implemented method of claim 7, wherein the algorithm is configured to sum all absolute values of inner products of the respective diffusion gradients for each possible group of the N groups and to select a highest value sum from among all possible groups of the N groups as the cost function.

9. The computer-implemented method of claim 7, wherein the algorithm is configured to sum all absolute values of inner products of the respective diffusion gradients for each possible group of the N groups, to calculate a sum of squares of the respective diffusion gradients for each possible group of the N groups, and to sum both the sum of all absolute values of the inner products and the sum of squares for each possible group of the N groups, and wherein the algorithm is configured to select a highest sum value of the sum of the sum of all absolute values of the inner products and the sum of squares from among all possible groups of the N groups as the cost function.

10. A system for performing magnetic resonance diffusion weighted imaging of an object, comprising:
a memory encoding processor-executable routines; and
a processor configured to access the memory and to execute the processor-executable routines, wherein the processor-executable routines, when executed by the processor, cause the processor to:
generate a diffusion weighted imaging sequence where all diffusion gradients are allocated into N groups such that all imaging slices are acquired for all the diffusion gradients corresponding to a group of the N groups back-to-back in $A_n$*TR, wherein N is two or larger, wherein $A_n$ is a number of diffusion gradients of each group of the N groups and TR is repetition time, and wherein in each TR every diffusion gradient of the group of the N groups is applied at least once; and
acquire imaging slices for multiple groups of the N groups utilizing the diffusion weighted imaging sequence during a scan of an object utilizing a magnetic resonance imaging scanner.

11. The system of claim 10, wherein $A_n$*TR is less than a total time for the scan.

12. The system of claim 10, wherein $A_n$ comprises two diffusion gradients and respective encoding directions of the two diffusion gradients are perpendicular with respect to each other.

13. The system of claim 10, wherein $A_n$ comprises three diffusion gradients and respective encoding directions of the three diffusion gradients are perpendicular with respect to each other.

14. The system of claim 10, wherein some groups of the N groups comprise diffusion gradients with different b-values.

15. The system of claim 10, wherein each group of the N groups comprises diffusion gradients having at least two perpendicular encoding directions and at least two different b-values.

16. The system of claim 10, further comprising, prior to generating the diffusion weighted imaging sequence, selecting, via the processor, respective diffusion gradients from among all the diffusion gradients for each group of the N groups utilizing an algorithm that minimizes cost function.

17. The system of claim 16, wherein the algorithm is configured to sum all absolute values of inner products of the respective diffusion gradients for each possible group of the N groups and to select a highest value sum from among all possible groups of the N groups as the cost function.

18. A non-transitory computer-readable medium, the non-transitory computer-readable medium comprising processor-executable code that when executed by a processor, causes the processor to:

generate a diffusion weighted imaging sequence where all diffusion gradients are allocated into N groups such that all imaging slices are acquired for all the diffusion gradients corresponding to a group of the N groups back-to-back in $A_n$*TR, wherein N is two or larger, wherein $A_n$ is a number of diffusion gradients of each group of the N groups and TR is repetition time, and wherein in each TR every diffusion gradient of the group of the N groups is applied at least once; and acquire imaging slices for multiple groups of the N groups utilizing the diffusion weighted imaging sequence during a scan of an object utilizing a magnetic resonance imaging scanner.

19. The non-transitory computer-readable medium of claim 18, wherein $A_n$*TR is less than a total time for the scan.

20. The non-transitory computer-readable medium of claim 18, wherein $A_n$ comprises two diffusion gradients and respective encoding directions of the two diffusion gradients are perpendicular with respect to each other.

* * * * *